United States Patent
Crotty et al.

(10) Patent No.: US 6,664,807 B1
(45) Date of Patent: Dec. 16, 2003

(54) REPEATER FOR BUFFERING A SIGNAL ON A LONG DATA LINE OF A PROGRAMMABLE LOGIC DEVICE

(75) Inventors: Patrick J. Crotty, San Jose, CA (US); Jinsong Oliver Huang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 2 days.

(21) Appl. No.: 10/056,724

(22) Filed: Jan. 22, 2002

(51) Int. Cl.[7] ............................................. H03K 19/177
(52) U.S. Cl. .............................. 326/40; 326/39; 326/41
(58) Field of Search ...................................... 376/38–41

(56) References Cited

U.S. PATENT DOCUMENTS

| | | |
|---|---|---|
| 3,983,543 A | 9/1976 | Cordaro |
| 4,154,978 A | 5/1979 | Tu |
| 4,371,797 A | 2/1983 | Frank |
| 4,390,970 A | 6/1983 | Kay |
| 4,446,382 A | 5/1984 | Moore et al. |
| 4,544,854 A | 10/1985 | Ulmer et al. |
| 4,642,487 A | 2/1987 | Carter |
| 4,695,740 A | 9/1987 | Carter |
| 4,709,173 A | 11/1987 | Nishimichi et al. |
| 4,713,557 A | 12/1987 | Carter |
| 4,758,745 A | 7/1988 | Elgamal et al. |
| 4,835,418 A * | 5/1989 | Hsieh .......................... 307/473 |
| 4,855,619 A | 8/1989 | Hsieh et al. |
| RE34,363 E | 8/1993 | Freeman |
| 5,517,135 A | 5/1996 | Young |
| 6,037,800 A * | 3/2000 | Trimberger ................... 326/38 |

FOREIGN PATENT DOCUMENTS

| | | |
|---|---|---|
| GB | 335108 | 11/1930 |
| JP | 137616 | 1/1978 |
| JP | 141836 | 11/1980 |
| JP | 191535 | 11/1983 |

OTHER PUBLICATIONS

Mead and Conway, Introduction to VLSI Systems, Addision–Wesley Pub. co., Reading, Mass., Oct. 1980, pp. 220–233.
Hung–Cheng Hsieh et al., "A Second Generation User–Programmable Gate Array," 1987 IEEE, Custom Integrated Circuits Conference, pp. 515–521.
R.D. Harrod and H.R. Moore, "Ungated Common I/O Buffer for Card Testing", IBM Technical Disclosure Bulletin, vol. 21, No. 6, Nov. 1978.

\* cited by examiner

*Primary Examiner*—Anh Tran
(74) *Attorney, Agent, or Firm*—E. Eric Hoffman; Edel M. Young (57) ABSTRACT

A configuration memory array for a programmable logic device includes an array of configuration memory cells arranged in rows and columns. Initially, each of the configuration memory cells is reset to a reset state. Each row of configuration memory cells is coupled to a corresponding data line and data line driver. During configuration, each data line driver drives a configuration data value having a first state or a second state onto the corresponding data line. A configuration data value having the first state has a polarity that tends to flip the reset state of a configuration memory cell. A repeater cell is connected to an intermediate location of each data line. Each repeater cell improves the drive of configuration data values having the first state.

23 Claims, 5 Drawing Sheets

REPEATER FOR BUFFERING A SIGNAL ON A LONG DATA LINE OF A PROGRAMMABLE LOGIC DEVICE

FIELD OF THE INVENTION

The present invention relates to a repeater circuit. More specifically, the present invention relates to a repeater cell for buffering signals on a long data line of a programmable logic device, such as a field programmable gate array (FPGA).

BACKGROUND OF THE INVENTION

A conventional field programmable gate array (FPGA) typically includes configurable input/output blocks (IOBs), configurable logic blocks (CLBs), and a configurable interconnect structure. These elements are configured in response to configuration data values that are stored in an array of configuration memory cells of the FPGA. The configuration data values are selected to configure the FPGA to perform a desired function.

Figure 1A:
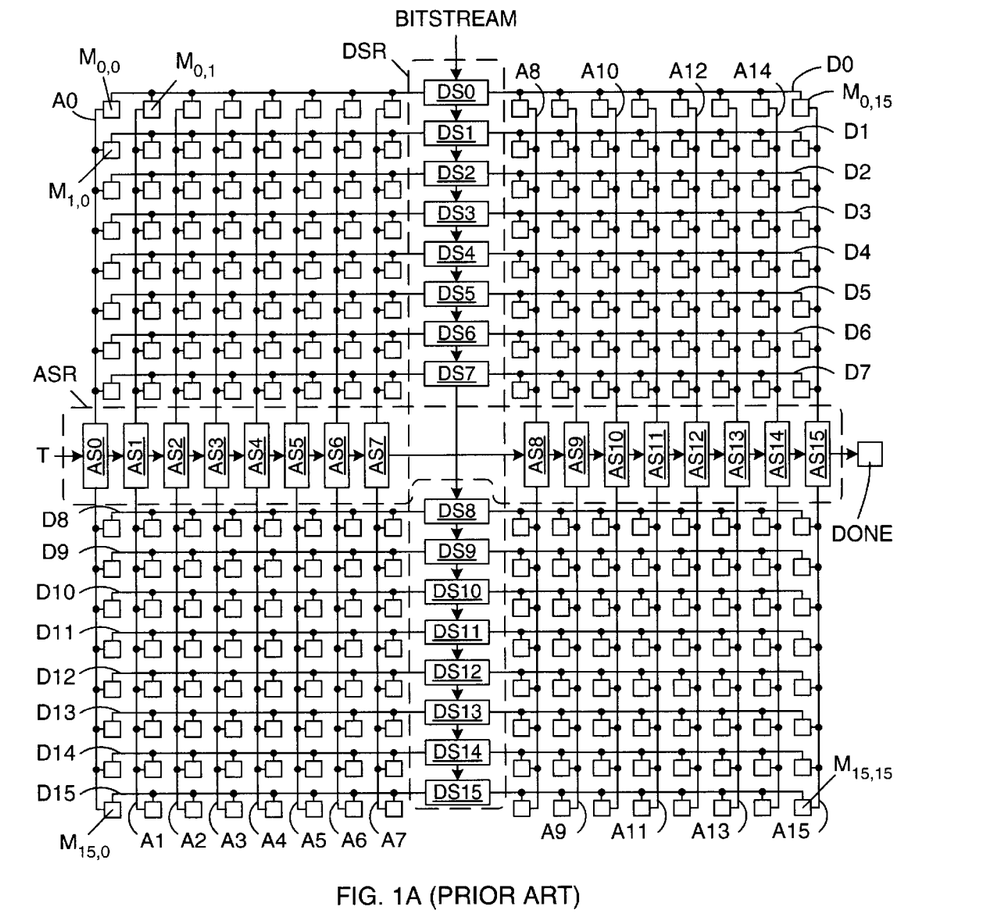
FIG. 1A is a block diagram illustrating a conventional configuration memory array.

FIG. 1A is a block diagram of a conventional array of configuration memory cells (i.e., a configuration memory array) such as that used by Xilinx, Inc., assignee of the present invention. The configuration memory array of FIG. 1A is a 16-bit by 16-bit array, which includes 256 configuration memory cells. In general, each of the configuration memory cells is identified by a reference character $M_{X,Y}$ where X and Y correspond to the row and column, respectively, of the configuration memory cell. A typical array of configuration memory cells in a commercial device has on the order of 20,000 to one million configuration memory cells. Therefore, the array of FIG. 1A is much smaller than is typically used in a commercial embodiment, but nevertheless shows the structure of a conventional configuration memory array.

The configuration memory cell array is initially erased prior to configuration, such that all of the configuration memory cells provide a logic "0" output value. Then the configuration data values are provided to the FPGA in a configuration bit stream (BITSTREAM). To load the configuration data values into the configuration memory array shown in FIG. 1A, configuration data values in the configuration bit stream are shifted into a data shift register DSR under control of a clocking mechanism until a frame of data (16 bits wide in this example, but several thousand in a commercial device) has been shifted into bit positions $DS_0$ through $DS_{15}$ of the data shift register DSR. This frame of configuration data values is then shifted in parallel on data lines $D_0$ through $D_{15}$ into a column of configuration memory cells addressed by address shift register ASR.

Address shift register ASR addresses the columns of configuration memory cells in response to a token (T), that is sequentially shifted through the bit locations $AS_0$–$AS_{15}$ of the address shift register ASR in response to a clocking mechanism. The token T is initially loaded into bit location $AS_0$, which causes a logic high address signal to be asserted on the address line $A_0$. As a result, the first frame of configuration data values stored in bit locations $DS_0$–$DS_{15}$ are written to the configuration memory cells ($M_{0,0}$–$M_{15,0}$) in the first column of the configuration memory array. The token T, is shifted to the right each time that a frame is loaded into a column of the configuration memory array. When the token high bit shifts out to the right, a DONE circuit is activated, thereby indicating that the configuration of the FPGA is complete. In some FPGAs, address shift register ASR is replaced with an address register that is directly loaded from a decoded bus.

Figure 1B:
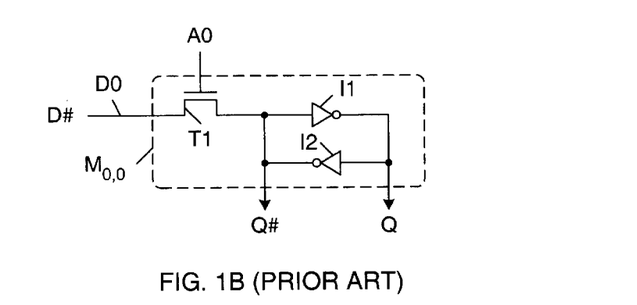
FIG. 1B is a circuit diagram illustrating a conventional configuration memory cell.

FIG. 1B is a simplified circuit diagram of configuration memory cell $M_{0,0}$. Configuration memory cell $M_{0,0}$ includes a latch formed by cross-coupled inverters I1 and I2. This latch stores a configuration data value transmitted through pass transistor T1. During configuration, when the token (T) is shifted into address shift register bit location $AS_0$ (FIG. 1A), the resulting high signal on address line $A_0$ is applied to the gate of pass transistor T1, thereby allowing the configuration data value stored in data shift register bit location $DS_0$ to enter the latch via data line $D_0$. Note that the configuration data value has a value of D#. The configuration data value (Q) stored in configuration memory cell $M_{0,0}$ is one of a group of memory cells used to control the configuration of a corresponding IOB, CLB or interconnect structure.

As MOS dimensions get smaller, and more system gates are included in a single FPGA, the structure of data lines (e.g., data lines $D_0$–$D_{15}$) becomes critical in the performance of the configuration circuit. Each of the data lines is driven solely by a data line driver in the data shift register DSR. The length-to-width (L/W) ratio of the data line between the data line driver and the configuration memory cells can become so large that the resistance of the data line dominates the success of writing a logic "1" value to the configuration memory cell. It would therefore be desirable to provide a data line configuration that allows configuration memory cells to be successfully written as FPGA dimensions become smaller.

SUMMARY

Accordingly, the present invention provides a repeater cell, which is connected to an intermediate location of a data line, thereby effectively reducing the L/W ratio of the data line by half. The repeater cell operates in response to the configuration data value being driven on the data line and a write enable signal that is asserted during configuration of the array. If the configuration data value being driven on the data line has a first voltage level, which would have to flip the initial (reset) state of a configuration memory cell, the repeater cell pulls the data line to the first voltage level, thereby improving the signal drive on the data line. The repeater cell enables a longer data line to be successfully driven.

In one embodiment, the repeater cell includes a logic circuit coupled to receive the configuration data value being driven on the data line and the write enable signal. When the configuration data value has the first logic level, and the write enable signal is asserted, the logic circuit generates a signal that turns on a transistor coupled between the data line and a terminal that supplies the first voltage, thereby pulling the data line to the first voltage.

In another embodiment, if the configuration data value being driven on the data line has a second voltage level having a different logic level than the first voltage level, the repeater cell pulls the data line to the second voltage level, thereby improving the signal drive on the data line.

In yet another embodiment, the repeater cell includes a tri-state driver, which is enabled during a write operation, and disabled during a read-back operation. When disabled, the repeater cell effectively separates the corresponding data line into a first data line section, which is coupled to the driver circuit, and a second data line section, which is coupled to a configuration memory cell to be read. During a first phase of a read-back operation, the first and second data line sections are pre-charged. During a second phase of the read-back operation, the configuration memory cell is coupled to the second data line section. If the configuration memory cell stores a configuration data value having a first logic value, then the first and second data line sections are discharged. If the configuration memory cell stores a configuration data value having a second logic value opposite the first logic value, then the first and second data line sections are prevented from being discharged. A sense amplifier senses the charge on the first data line section to determine whether the configuration memory cell stores a first or second logic value.

The present invention will be more fully understood in view of the following description and drawings.

DETAILED DESCRIPTION

Figure 2:
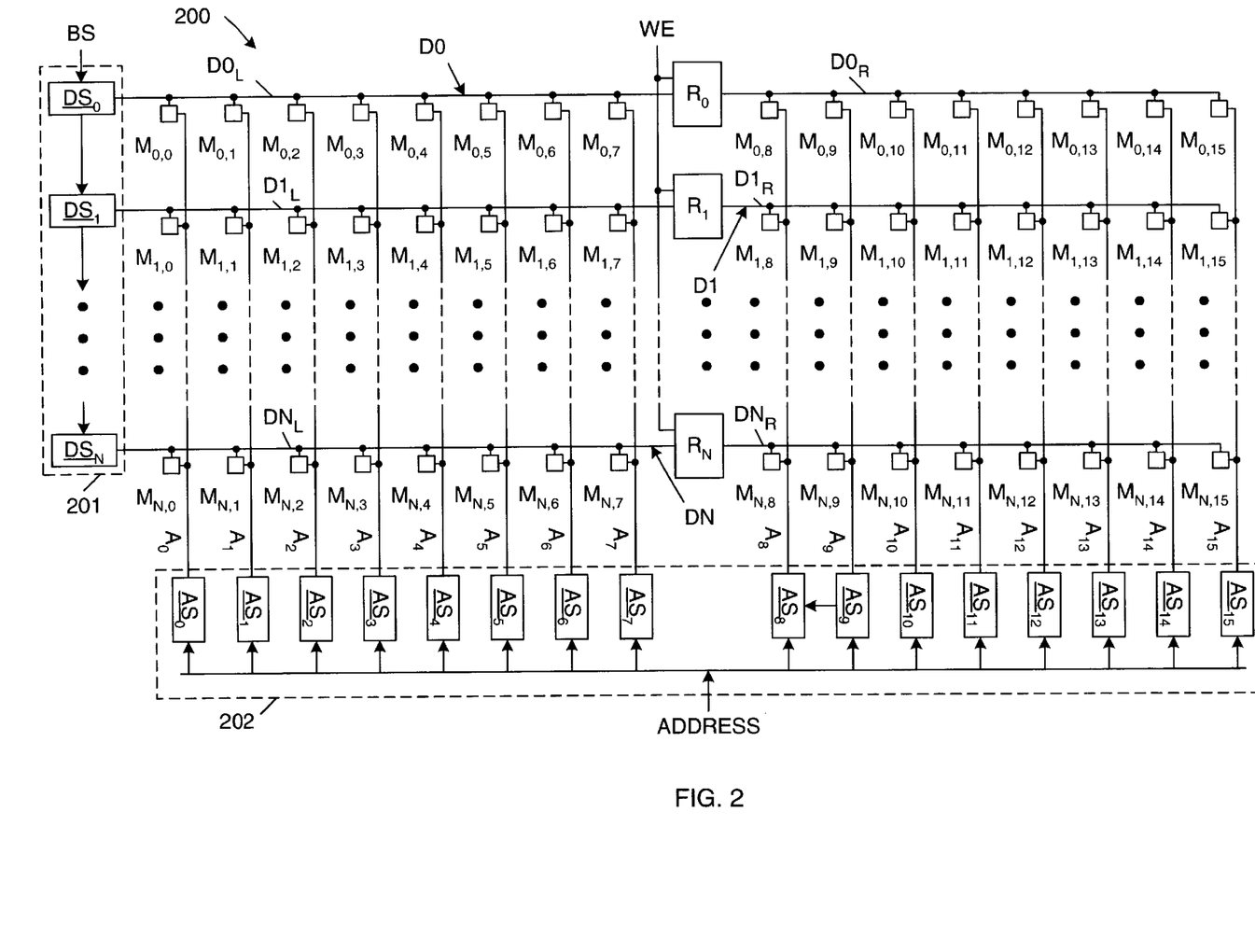
FIG. 2 is a block diagram of a configuration memory array that includes repeater cells in accordance with one embodiment of the present invention.

FIG. 2 is a block diagram of a portion of a configuration memory array 200 in accordance with one embodiment of the present invention. Configuration memory array 200 includes a data shift register 201, a column address register 202, an array of configuration memory cells $M_{0,0}$–$M_{N,15}$, and repeater circuits $R_0$–$R_N$. Data shift register 201 includes N bit locations $DS_0$–$DS_N$, wherein N is equal to the number of rows in configuration memory array 200. A frame of N configuration data values is serially shifted into data shift register 201 prior to being written to a column of configuration memory array 200. Data bit locations $DS_0$–$DS_N$ are coupled to data lines $D_0$–$D_N$, respectively.

Data lines $D_0$–$D_N$ are logically divided into half data lines by repeater circuits $R_0$–$R_N$, respectively. More specifically, repeater circuits $R_0$–$R_N$ divide data lines $D_0$–$D_N$ into left half data lines $D0_L$–$DN_L$ and right half data lines $D0_R$–$DN_R$, respectively. Although repeater circuits $R_0$–$R_N$ are located at the middle of data lines $D_0$–$D_N$, this is not necessary.

Address register 202 includes 16 bit locations $AS_0$–$AS_{15}$, one for each of the 16 columns of configuration memory array 200. In other embodiments, configuration memory array 200 can have other numbers of columns. In most embodiments, configuration memory array 200 will have many more columns. Address register 202 is loaded with a value corresponding with the column or columns of configuration memory cells to be written. For example, address register 202 can be initially be loaded with an address value of "1000 0000 0000 0000", thereby causing bit location $AS_0$ to store a logic "1" value. Under this condition, the logic "1" value selects the memory cells $M_{0,0}$–$M_{N,0}$ in the first column of the configuration memory array. As a result, these memory cells $M_{0,0}$–$M_{N,0}$ are enabled to load the configuration data values on data lines $D_0$–$D_N$. Address register 202 can then be loaded with address values that cause bit locations $A_1$–$A_{15}$ to sequentially store a logic "1" value. In an alternative embodiment, address register 202 can be operated as an address shift register in response to a token in the manner described above in connection with FIG. 1.

As described in more detail below, repeater circuits $R_0$–$R_N$, help boost the signal required to write logic "1" configuration data values to the configuration memory cells.

Initially, each of the memory cells $M_{0,0}$–$M_{N,16}$ are reset, such that these memory cells provide a logic "0" output configuration data value (Q). This reset mechanism is shown in more detail in FIGS. 3 and 4. Because each of the memory cells initially stores a logic "0" configuration data value, writing a logic "0" configuration data value to a configuration memory cell does not present a problem. That is, a driver circuit in data shift register 201 is not required to change the state of a configuration memory cell when writing a logic "0" configuration data value to a configuration memory cell that already stores a logic "0" value. However, writing a logic "1" configuration data value to a configuration memory cell that is storing a logic "0" value requires flipping the state of the memory cell. In this case, a data line must be driven strongly enough to flip the state of a configuration memory cell to a logic "1" value. Repeater cells $R_0$–$R_N$ ensure that data lines D0–DN are driven strongly enough to flip the state of any configuration memory cell in the configuration memory array.

Figure 3:
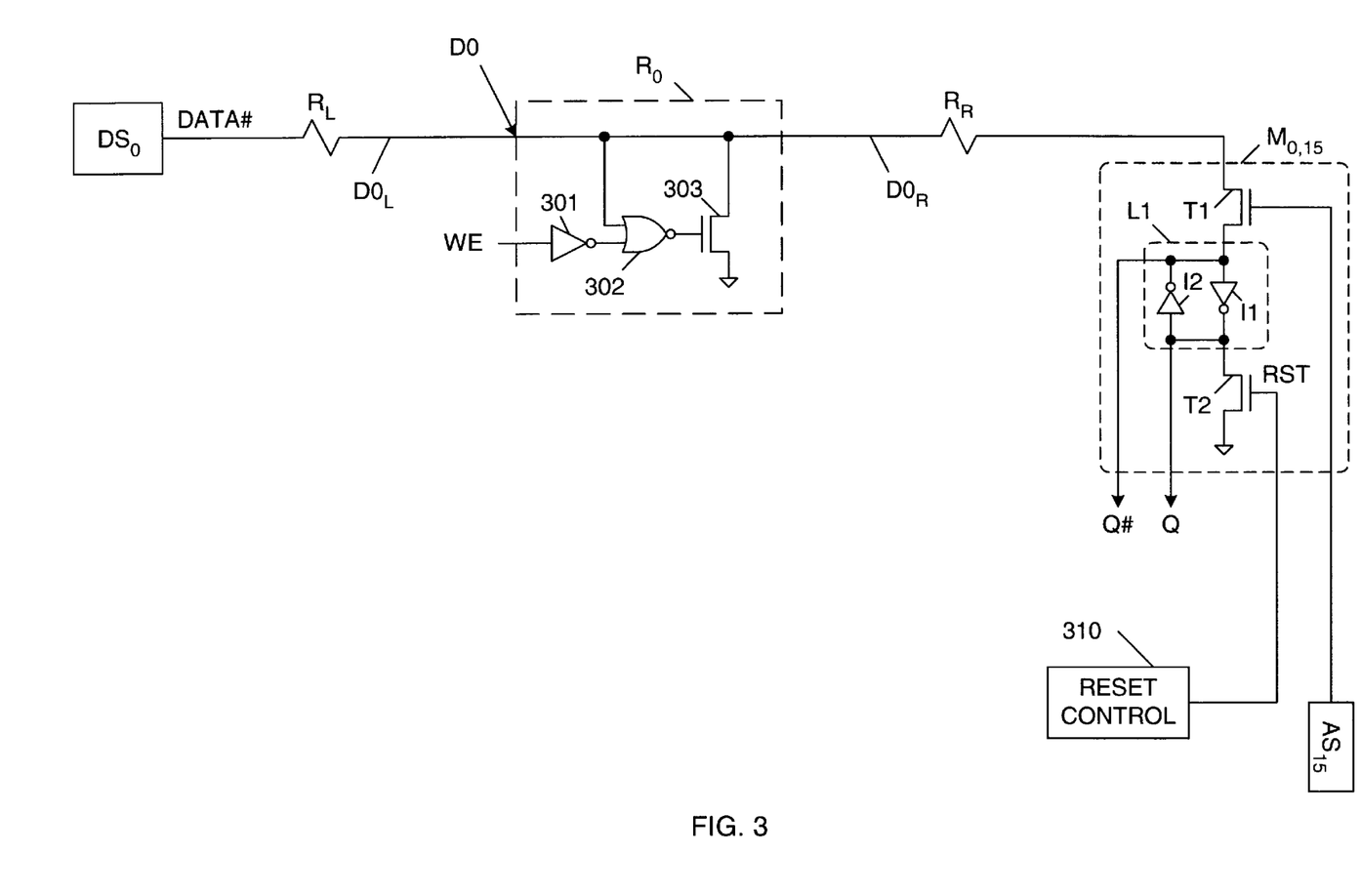
FIG. 3 is a circuit diagram of a portion of a row of the configuration memory array of FIG. 2 in accordance with one embodiment of the present invention.

FIG. 3 is a circuit diagram illustrating a portion of the first row of configuration memory array 200 in accordance with one embodiment of the present invention. The illustrated portion of the first row includes bit location $DS_0$ of data shift register 201, data line D0, repeater cell $R_0$ and configuration memory cell $M_{0,15}$. Although configuration memory cells $M_{0,0}$–$M_{0,14}$ are not shown in FIG. 3, it is understood that these configuration memory cells are also coupled to data line D0 in the same manner as memory cell $M_{0,15}$. Bit location $DS_0$ includes a data line driver, which is controlled to drive the data signal DATA# onto data line D0.

Configuration memory cell $M_{0,15}$ includes n-channel access transistors T1 and T2, and a latch L1 formed by cross-coupled inverters I1 and I2. The need for a reset transistor T2 relates to operating the integrated circuit at lower voltages. As voltages scaled down and transistors got faster, the memory cell of FIG. 2 did not initialize correctly, and it became very difficult to write a logic level 0 into the memory cell once it was either initialized or configured as a logic 1. This additional transistor T2 allows memory cell $M_{0,15}$ to be reset at initialization, as well as after a logic 1 has been stored in memory cell $M_{0,15}$. The advantage of this memory cell, is that it requires only one data line per memory cell row to be routed through the integrated circuit, and still guarantee that the nodes are always pulled to ground through an NMOS transitor for either writing a logic 1 or resetting a logic 0 into memory cell $M_{0,15}$. Also, providing both transistors T1 and T2 as n-channel transistors allows for a more convenient layout of the six transistors of memory cell $M_{0,15}$ because transistors of inverters I1 and I2 can be the same size, and the four n-channel transistors in memory cell $M_{0,15}$ can by physically close together.

More importantly, connecting reset transistor T2 to the opposite node of latch L1 from the node at which transistor T1 is connected allows both states of latch L1 to be achieved by pulling a node to logic "0" rather than logic "1.

Latch L1 is initially reset to store a logic "0" value by asserting a logic high reset signal RST to the gate of transistor T2 using a reset control circuit 310. In the described embodiment, reset control circuit 310 is coupled to all of the memory cells in configuration memory array 200. As a result, the Q configuration data value initially has a logic "0" value and the complementary Q# configuration data value has a logic "1" value. When it is time to write a configuration data value to configuration memory cell $M_{0,15}$, the desired configuration data value is shifted into bit location $DS_0$ of data shift register 201, and a logic high bit is loaded into bit location $AS_{15}$ of address register 202.

The configuration data value in bit location $DS_0$ is driven onto data line D0 as data signal DATA#. The DATA# signal has a logic value that is opposite the value to be written to the configuration memory cell. Thus, the DATA# signal has a logic "0" value to write a logic "1" value to configuration memory cell $M_{0,15}$. Conversely, the DATA# signal has a logic "1" value to write a logic "0" value to configuration memory cell $M_{0,15}$. To provide this inverse logic, the data line driver of bit location $DS_0$ can include an inverter, which drives the configuration data value stored in bit location $DS_0$ onto data line D0. Alternatively, the configuration data values can be initially selected in view of this inverse logic.

The logic high value stored in bit location $AS_{15}$ is applied to the gate of transistor T1, thereby turning on this transistor, and coupling latch L1 to data line D0.

Repeater cell $R_0$ is coupled to the middle of data line D0 as illustrated. The left half data line $D0_L$ exhibits a resistance $R_L$, and the right half data line $D0_R$ exhibits a resistance $R_R$. These resistances are high enough that it would be impossible to reliably write a logic "1" configuration data value to configuration memory cell $M_{0,15}$ without the assistance of repeater cell $R_0$. These high resistances $R_L$–$R_R$ result from a relatively high length-to-width ratio of the data line D0. Repeater cell $R_0$ includes inverter 301, NOR gate 302 and n-channel pull-down transistor 303. Inverter 301 is coupled to receive a write enable signal WE, and in response, provide an output signal to an input terminal of NOR gate 302. The other input terminal of NOR gate 302 is coupled to data line D0. The output terminal of NOR gate 302 is coupled to the gate of transistor 303. The source of transistor 303 is coupled to the ground supply terminal, and the drain of transistor 303 is coupled to data line D0.

When configuration data values are not being written, the WE signal is de-asserted to a logic low voltage. Under these conditions, NOR gate 302 provides a logic low voltage to the gate of n-channel transistor 303, thereby turning off this transistor, and allowing data line $D0_R$ to float.

When configuration data values are being written to the configuration memory array, the write enable signal WE is asserted to a logic high voltage. Under these conditions, inverter 301 provides a logic low signal to NOR gate 302. As a result, NOR gate 302 provides an output signal equal to the inverse of the DATA# signal on data line D0. Thus, if the DATA# signal has a logic "0" value, then NOR gate 302 provides a logic high value to the gate of transistor 303. In response, transistor 303 turns on, thereby further pulling the voltage on data line D0 down toward a voltage of 0 Volts. In this manner, repeater cell $R_0$ ensures that the voltage on data line D0 is low enough to provide a logic low voltage to the input of inverter I1. This logic low voltage is sufficient to flip the state of latch L1 from a logic "0" Q output signal to a logic "1" Q output signal.

If the DATA# signal has a logic "1" value, then NOR gate 302 provides a logic low value to the gate of transistor 303. In response, transistor 303 turns off, thereby isolating data line D0 from the ground voltage supply. As a result, the logic "1" DATA# signal is transmitted to the input terminal of inverter I1. The input terminal of inverter I1 is already at a voltage representative of a logic "1" state as a result of the initial reset operation. Thus, latch L1 will remain in this original reset state. Advantageously, the voltage of the logic "1" DATA# signal only has to be high enough to prevent the state of latch L1 from flipping from a logic "0" state to a logic "1" state.

Note that repeater cells $R_0$–$R_N$ operate in parallel to write configuration data values to an entire column of the configuration memory array.

Figure 4:
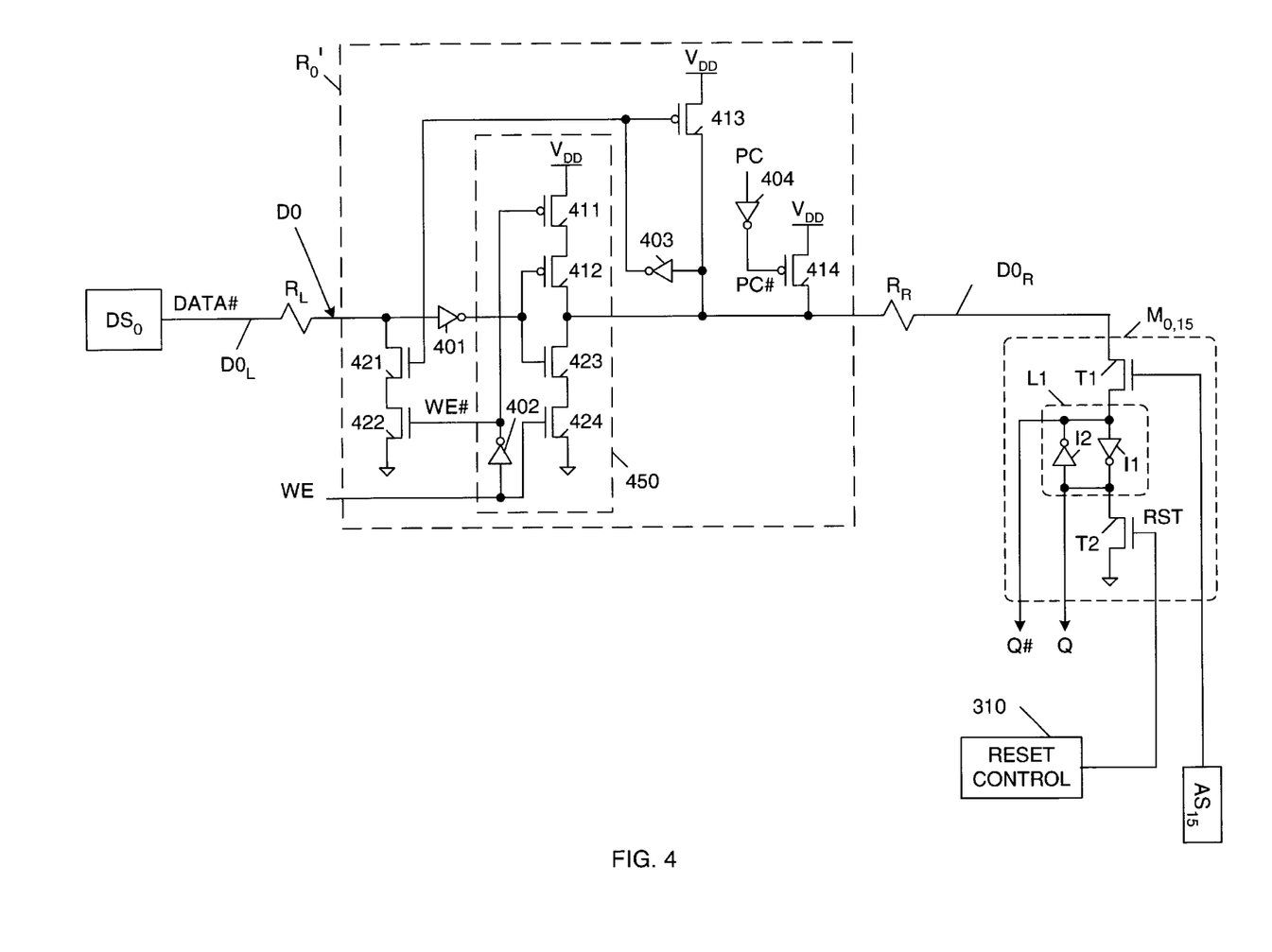
FIG. 4 is a circuit diagram of a portion of a row of the configuration memory array of FIG. 2 in accordance with another embodiment of the present invention.

FIG. 4 is a circuit diagram illustrating a portion of the first row of configuration memory array 200 in accordance with another embodiment of the present invention. Similar elements in FIGS. 3 and 4 are labeled with similar reference numbers. Thus, the circuit of FIG. 4 includes data bit location $DS_0$, data line D0 (having resistances $R_L$ and $R_R$), address bit location $AS_{15}$, and configuration memory cell $M_{0,15}$ (which includes access transistors T1–T2 and latch L1). In addition, the circuit of FIG. 4 includes repeater cell $R_0'$, which replaces repeater cell $R_0$ of FIG. 3. As described in more detail below, repeater cell $R_0'$ improves both write and read-back operations of the configuration memory cells coupled to data line D0.

Repeater cell $R_0'$ includes inverters 401–404, p-channel transistors 411–414 and n-channel transistors 421–424. P-channel transistors 411–412, n-channel transistors 423–424 and inverter 402 are connected to form a tri-state inverter circuit 450 that is enabled and disabled in response to the write enable signal WE. Inverter 401 and inverter circuit 450 are connected in series with data line D0 to form a tri-state driver circuit.

N-channel transistors 421–422 are connected in series between data line D0 and the ground supply terminal. P-channel pull-up transistor 413 is coupled between data line D0 and the $V_{DD}$ voltage supply terminal. The input terminal of inverter 403 is connected to data line D0, and the output terminal of inverter 403 is connected to the gates of transistors 413 and 421. The gate of n-channel transistor 422 is coupled to receive the inverse of the write enable signal (WE#) from inverter 402. P-channel pull-up transistor 414 is connected between data line D0 and the $V_{DD}$ voltage supply terminal. The input terminal of inverter 404 is coupled to receive a pre-charge signal (PC), and the output terminal of inverter 404 is coupled to provide the inverse of the pre-charge signal (PC#) to the gate of p-channel transistor 414.

Repeater cell $R_0'$ operates as follows in accordance with one embodiment of the present invention. The write enable signal WE is asserted to a logic "1" value when writing a configuration data value to a configuration memory cell coupled to data line D0. For example, the write enable signal WE is asserted to a logic "1" value when writing a configuration data value to memory cell $M_{0,15}$. The asserted write enable signal WE turns on transistors 411 and 424, thereby enabling inverter circuit 450. As a result, inverter 401 and inverter circuit 450 amplify and transmit the DATA# signal to memory cell $M_{0,15}$. Note that inverter circuit 450 will either pull up the right half data line $D0_R$ to the $V_{DD}$ supply voltage, or pull down the right half data line $D0_R$ to the ground supply voltage. By buffering the DATA# signal at the middle of the data line in this manner, repeater cell $R_0'$ effectively reduces the length-to-width ratio of the data line by half. Note that the pre-charge signal PC has a logic "0" value during the write operation, thereby turning off p-channel transistor 414.

A read-back operation is performed as follows. The write enable signal WE is de-asserted to a logic "0" value, thereby turning off transistors 411 and 424, and disabling inverter circuit 450. As a result, left half data line $D0_L$ is isolated from right half data line $D0_R$. The logic low write enable signal WE also causes n-channel transistor 422 to turn on. A read-back operation includes a pre-charge phase and a read phase. During the pre-charge phase, the pre-charge signal PC is asserted to a logic "1" value. Under these conditions, p-channel transistor 414 is turned on, thereby pulling up the right half data line $D0_R$ to the $V_{DD}$ supply voltage. The high voltage on right half data line $D0_R$ causes inverter 403 to apply a logic low voltage to the gates of transistors 413 and 421. In response, p-channel transistor 413 turns on, and n-channel transistor 421 turns off. P-channel transistor 413 is a relatively weak transistor that pulls up the voltage on right half bit line $D0_R$. Together, p-channel transistor 413 and inverter 403 form a weak half-latch circuit. The data line driver of bit location $DS_0$ is controlled to pre-charge the left half data line $D0_L$ to the $V_{DD}$ supply voltage.

During the read phase, the pre-charge signal PC is de-asserted low, thereby turning off pull-up transistor 414. The $AS_{15}$ bit is then asserted high, thereby turning on access transistor T1 in configuration memory cell $M_{0,15}$, and coupling latch L1 to the right half data line $D0_R$. If configuration memory cell $M_{0,15}$ stores a logic "0" value (i.e., Q# has a logic "1" value), then the configuration memory cell will not pull down on the pre-charged right half data line $D0_R$, and the half-latch formed by inverter 403 and p-channel transistor 413 will continue to pull up the right half data line $D0_R$. As a result, n-channel transistor 421 remains off, thereby allowing the left hand data line $D0_L$ to remain at the pre-charged logic high state. A sense amplifier in data bit location $DS_0$ senses this logic high state to determine that configuration memory cell $M_{0,15}$ stores a logic high configuration data value.

If configuration memory cell $M_{0,15}$, stores a logic "1" value (i.e., Q# has a logic "0" value), then the configuration memory cell will discharge the pre-charged right half data line $D0_R$. The voltage on right half data line $D0_R$ is pulled down to a voltage that is low enough to flip the state of the half-latch formed by inverter 403 and p-channel transistor 413. At this time, inverter 403 provides a logic high voltage to the gate of n-channel transistor 421, thereby turning on this transistor 421. When transistor 421 is turned on, the charge stored on left half bit line $D0_L$ is quickly discharged through turned on transistors 421 and 422. The sense amplifier in data bit location $DS_0$ senses this logic low state to determine that configuration memory cell $M_{0,15}$ stores a logic low configuration data value.

In the foregoing manner, the repeater cell $R_0'$ effectively reduces the data line length by half, and thereby makes the write and read-back operations of the configuration memory cells significantly easier than in prior art configurations.

Figure 5:
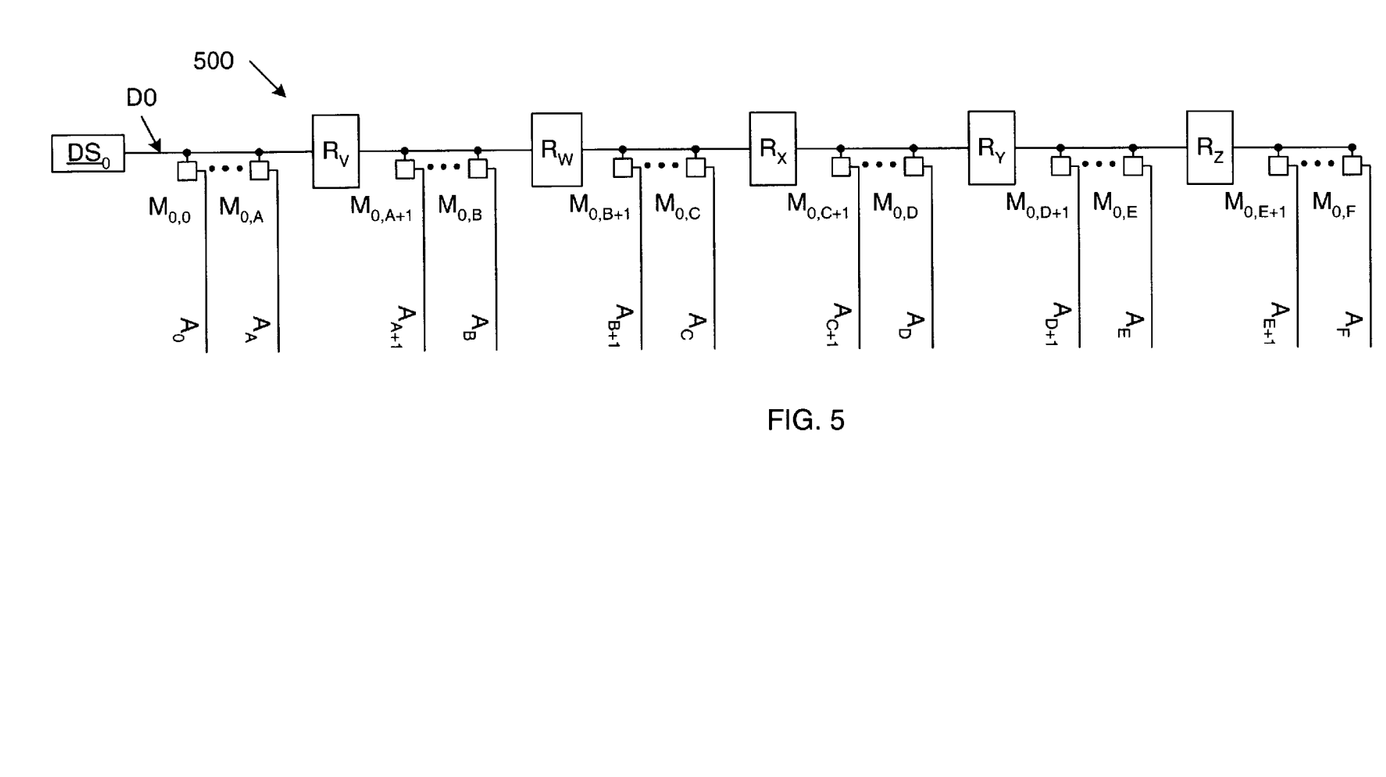
FIG. 5 is a block diagram illustrating a plurality of repeater cells located along a single data line in accordance with another embodiment of the present invention.

Although the above-described embodiments teach a single repeater cell along each data line, it is understood that multiple repeater cells can be placed along a data line to further reduce the effective length of the data line. FIG. 5 is a block diagram illustrating a plurality of repeater cells $R_V$–$R_Z$ located along a single data line D0 with a plurality of configuration memory cells $M_{0,0}$–$M_{0,F}$. Repeater cells $R_V$–$R_Z$ can be of the type illustrated in FIG. 3 or FIG. 4.

Although the invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A configuration memory array for a programmable logic device comprising:

an array of configuration memory cells arranged in a plurality of rows and columns, wherein the configuration memory cells store configuration data values used to configure the programmable logic device;

a plurality of data lines, wherein each data line is coupled to a corresponding row of configuration memory cells;

a plurality of data line drivers, wherein each data line driver is coupled to a corresponding data line, each data line driver being configured to drive a configuration data value onto the corresponding data line; and a plurality of repeater cells, wherein each repeater cell is located along a corresponding data line, and wherein each of the repeater cells comprises a logic circuit coupled to the corresponding data line, and coupled to receive a write enable signal, the logic circuit being configured to pull the corresponding data line to a first voltage having a first logic level when the write enable signal is asserted and the corresponding data line has a voltage representative of the first logic level.

2. The configuration memory array of claim 1, wherein a repeater cell is located at the middle of each data line.

3. The configuration memory array of claim 1, wherein multiple repeater cells are located along each data line.

4. The configuration memory array of claim 1, wherein each of the configuration memory cells includes an access transistor coupled to a corresponding data line and a latch coupled to the access transistor.

5. The configuration memory array of claim 4, further comprising a plurality of address lines, wherein each of the access transistors in each column of configuration memory cells has a gate that is commonly connected to a corresponding address line.

6. A configuration memory array for a programmable logic device comprising:

an array of configuration memory cells arranged in a plurality of rows and columns, wherein the configuration memory cells store configuration data values used to configure the programmable logic device;

a plurality of data lines, wherein each data line is coupled to a corresponding row of configuration memory cells;

a plurality of data line drivers, wherein each data line driver is coupled to a corresponding data line, each data line driver being configured to drive a configuration data value onto the corresponding data line; and a plurality of repeater cells, wherein each repeater cell is located along a corresponding data line, wherein each of the repeater cells is coupled to receive a write enable signal, and, wherein each of the repeater cells is coupled to receive a pre-charge signal.

7. The configuration memory array of claim 1, wherein each logic circuit is further configured to leave a voltage on the corresponding data line unmodified when the write enable signal is asserted and the corresponding data line has a voltage representative of a second logic level, opposite the first logic level.

8. A configuration memory array for a programmable logic device comprising:

an array of configuration memory cells arranged in a plurality of rows and columns, wherein the configuration memory cells store configuration data values used to configure the programmable logic device;

a plurality of data lines, wherein each data line is coupled to a corresponding row of configuration memory cells;

a plurality of data line drivers, wherein each data line driver is coupled to a corresponding data line, each data line driver being configured to drive a configuration data value onto the corresponding data line; and a plurality of repeater cells, wherein each repeater cell is located along a corresponding data line, wherein each repeater cell comprises:

a logic gate having a first input terminal coupled to a corresponding data line and a second input terminal coupled to receive a write enable signal; and a transistor connected between the corresponding data line and a first voltage supply terminal, the transistor having a gate coupled to an output terminal of the logic gate.

9. The configuration memory array of claim 8, wherein the logic gate is a logical NOR gate, the transistor is an n-channel transistor, and the first voltage supply terminal is a ground voltage supply terminal.

10. The configuration memory array of claim 1, wherein each repeater cell comprises circuitry for improving the drive of a configuration data value on the corresponding data line having the first logic level.

11. The configuration memory array of claim 6, wherein each repeater cell comprises circuitry for improving the drive of a configuration data value read from a configuration memory cell on the corresponding data line.

12. The configuration memory array of claim 6, wherein each repeater cell comprises a tri-state driver circuit connected in series with the corresponding data line, thereby dividing the corresponding data line into a first data line section and a second data line section, the tri-state driver circuit being enabled during a write operation and disabled during a read operation.

13. The configuration memory array of claim 12, wherein each repeater cell further comprises:

means for pre-charging the first data line section and the second data line section in response to the pre-charge signal during a first phase of a read operation;

means for coupling a configuration memory cell storing a first logic level or a second logic level to the second data line section during a second phase of a read operation;

means for discharging the pre-charged first data line section if the configuration memory cell stores a first logic level, and for leaving the pre-charged first data line section floating if the configuration memory cell stores a second logic level; and means for sensing the first data line section during the second phase of the read operation.

14. The configuration memory array of claim 12, wherein each repeater cell further comprises:

a first transistor coupled between the second data line section and a first voltage supply terminal, the first transistor having a gate coupled to receive the pre-charge signal;

a second transistor coupled between the first data line section and a second voltage supply terminal; and a latch circuit having an input terminal coupled to the second data line section, and an output terminal coupled to a gate of the second transistor.

15. A method of operating a configuration memory array comprising a plurality of configuration memory cells arranged in rows and columns, wherein each row of configuration memory cells is coupled to a corresponding data line, the method comprising:

initially resetting each of the configuration memory cells, thereby placing each of the configuration memory cells in a reset state;

driving a configuration data value to each row of configuration memory cells on a data line during a write operation, each configuration data value having either a first logic level or a second logic level, opposite the first logic level; and pulling each data line being driven to the first logic level to a first voltage representative of the first logic level at an intermediate location of the data line, wherein the first voltage flips the reset state of any configuration memory cell coupled to receive the first voltage.

16. The method of claim 15, further comprising pulling each data line being driven to the first logic level to the first voltage at a plurality of intermediate locations of the data line.

17. The method of claim 15, wherein the step of pulling each data line being driven to the first logic level to the first voltage at an intermediate location of the data line comprises coupling each data line being driven to the first logic level to a voltage supply terminal coupled to receive the first voltage at the intermediate location of the data line.

18. The method of claim 17, wherein the coupling is performed by turning on a transistor connected between the intermediate location of the data line and the voltage supply terminal.

19. The method of claim 18, further comprising turning on the transistor in response to a control signal generated in response to a write enable signal and the first logic level of the data line.

20. The method of claim 15, further comprising enabling an access transistor of a configuration memory cell in each column of the configuration memory array.

21. The method of claim 15, further comprising leaving the voltage on each data line being driven to the second logic level unmodified.

22. A method of operating a configuration memory array comprising a plurality of configuration memory cells arranged in rows and columns, wherein each row of configuration memory cells is coupled to a corresponding data line, the method comprising:

driving a configuration data value onto a first data line section of a data line during a write operation;

transmitting the configuration data value from the first data line section of the data line to a second data line section of data line during a write operation using a tri-state buffer located at an intermediate location of the data line;

disabling the tri-state driver, thereby de-coupling the first data line section from the second data line section during a first phase of a read operation.

23. The method of claim 22, further comprising:

pre-charging the first data line section and the second data line section to a pre-charged state during the first phase of the read operation;

coupling the second data line section to a corresponding configuration memory cell during a second phase of the read operation, the configuration memory cell storing a configuration data value having a first logic state or a second logic state;

discharging the second data line section and the first data line section if the corresponding configuration memory cell stores a configuration data value having the second logic state;

allowing the first data line section to remain in the pre-charged state if the corresponding configuration memory cell stores a configuration data value having the first logic state; and sensing the first data line section during the second phase of the read operation.

* * * * *